United States Patent
Schreib

Patent Number: 6,028,893
Date of Patent: Feb. 22, 2000

[54] METHOD AND SIGNAL EVALUATION APPARATUS FOR DATA REDUCTION IN THE PROCESSING OF SIGNAL VALUES WITH A DIGITAL PROCESSING UNIT IN A TRANSMISSION SYSTEM

[75] Inventor: Franz Schreib, Munich, Germany

[73] Assignee: Siemens Aktiengesellschaft, Munich, Germany

[21] Appl. No.: 08/883,306

[22] Filed: Jun. 26, 1997

[30] Foreign Application Priority Data

Jun. 27, 1996 [DE] Germany .......................... 196 25 855

[51] Int. Cl.[7] .............................. H04B 3/46; H04B 17/00
[52] U.S. Cl. .......................... 375/225; 708/490; 708/495
[58] Field of Search ........................ 364/715.03, 715.04, 364/716.04, 748.01; 375/225, 227; 704/200, 201; 708/204, 205, 491, 495

[56] References Cited

U.S. PATENT DOCUMENTS

| | | | |
|---|---|---|---|
| 4,511,990 | 4/1985 | Hagiwara et al. | 364/748 |
| 4,631,696 | 12/1986 | Sakamoto | 364/200 |
| 4,805,128 | 2/1989 | Nelsen et al. | 364/715.03 |
| 5,142,656 | 8/1992 | Fielder et al. | 381/37 |

FOREIGN PATENT DOCUMENTS

| | | |
|---|---|---|
| 15 37 325 | 2/1977 | Germany . |
| 33 28 344 C1 | 12/1984 | Germany . |
| 34 11 962 C2 | 5/1988 | Germany . |

OTHER PUBLICATIONS

AD7015 Specifications for Basestation Applications (these specifications are valid when the RX and TX sections are operating in parallel), REv. A12 May 1996, pp. 1–5; REv. Q9 Feb. 1996 pp. 1–39—One Technology Way.

Signalverrbeitung mit Gleitkomma–Arthmetic by A. Lacroix, Frankfurt am Main—Nachrichtentech, Elektron, Berlin 39 (1989) 2; pp 67–69.

European digital cellular telecommunication system (phase 2); Multiplexing and Multiple Access on the Radio Path, GMS 05.02 (4.3.0.); Jul. 1993, European Telecommunications Standards Institute.

*Primary Examiner*—Stephen Chin
*Assistant Examiner*—Mohammad Ghayour
*Attorney, Agent, or Firm*—Hill & Simpson

[57] ABSTRACT

A signal evaluation apparatus, and method, for data reduction in the processing of signal values of a digital signal processing unit, for example, in a mobile communication system, wherein a block with k signal values is inventively stored in fixed decimal point format and a maximum value of the k signal values of the block is defined. Subsequently, the k signal values of the block are converted into floating decimal point format, whereby individual mantissas and a common exponent are determined for the converted samples. The data rate can be substantially reduced depending on the selected number of bits for the presentation of the mantissas and exponents. Advantageously, the block corresponds to the samples of a radio block or a part thereof.

12 Claims, 2 Drawing Sheets a)     max = 1000 1111 11
       Presentation in 4 bit for mantissa by 6 x shift right
Result: e = 0110
           m = 1000         for 1000 1111 11 (575 dec)
           m = 0000         for 0000 1111 11 (63 dec)

b)     max = 1000 1111 11
       Presentation in 4 bit for mantissa by 6 x shift right and multiplication by
       factor = 1111 1111 11/1000 1111 11 = 1023/575 = 1,779
Result:    $e_{exp}$ = 0110      (shift factor)
           $e_{man}$ = 1000 1    (mantissa for exponent)
           m = 1111              for 1000 1111 11 (575 dec)
           m = 0001              for 0000 1111 11 (63 dec)

METHOD AND SIGNAL EVALUATION APPARATUS FOR DATA REDUCTION IN THE PROCESSING OF SIGNAL VALUES WITH A DIGITAL PROCESSING UNIT IN A TRANSMISSION SYSTEM

BACKGROUND OF THE INVENTION

1. Field of the Invention

The present invention is generally concerned with reducing the data rate in the processing of signal values with digital signal processing units. More specifically, the present invention is directed to a signal evaluation apparatus, and method, for data reduction in the processing of signal values in a transmission system wherein: (a) a block with k signal values is stored in fixed decimal point format; (b) a maximum value of the k signal values is defined; and (c) the k signal values are converted into floating decimal point format such that individual mantissas and a common exponent are determined for the converted k signal values.

2. Description of the Prior Art

Great data quantities are typically transmitted and processed in transmission systems such as, for example, the GSM mobile radio telephone system (global system for mobile communication) given either a mobile communication system or a modem connection. The received signal values are processed in digital signal processing units in a receiver device, whereby a data rate of 8.67 Mbit/s (for the in-phase and the quadrature component per 270833 samples at 16 bit per second) is to be processed. Such data processing is experienced, for example, in a GSM receiver after the proper analog-to-digital conversion.

According to the data sheet AD7015 of Analog Devcies, 1996, these digital signal values corresponding to the individual samples of the analog reception signal are presented as fixed decimal point numbers and are further processed in additional assemblies, for example, channel equalizers. Given the complexity associated with the processing of digital signal values in fixed decimal point format, a more compact presentation of the digital signal values is needed.

SUMMARY OF THE INVENTION

In an embodiment of the present invention, a block having k signal values is stored in fixed decimal point format and a maximum value of the k signal values of the block is defined. Subsequently, the k signal values of the block are converted into sloping decimal point format such that individual mantissas and a common exponent are determined for the converted k signal values. Depending on the selected number of bits for the presentation of the mantissas and exponents, the data rate can be substantially reduced. Referring to the GSM mobile radio telephone system, for example, a four-bit form of presentation in floating decimal point format can be respectively selected for the mantissas of the in-phase and of the quadrature component and for the exponents. As a result, the data rate is reduced by approximately a factor of 4. It is therefore possible to distribute the signal values, after the proper analog-to-digital conversion, over bus structures within, for example, the base station; thus, affording the structure of the base station more flexibility.

In an embodiment, the transmission system corresponds to a mobile communication system and the block corresponds to the samples (converted k signal values) of a radio block or a part thereof. A set of signal values to be processed in common is derived accordingly. These signal values correspond to the time sequence of the signal processing in a mobile communication system using radio blocks. However, half-blocks as in the GSM mobile radio telephone system can also be utilized as well as a separate block at the beginning of a radio block that is influenced by the transient response of the automatic gain control of the receiver.

In an embodiment, the signal values are respective values for the in-phase component and the quadrature component of the samples that are processed in common for the purpose of data reduction. In the evaluation of the in-phase component and the quadrature component, the amplitude of each component corresponds to the respective energy part of each component, so that a common maximum value can be defined for the two components. When the maximums of the two distributions clearly differ, the component having the lower energy part can be less clearly resolved.

Preferably, a common exponent suffices for the presentation of both the in-phase component and the quadrature component in the floating decimal point format and only the mantissas are separately determined. A further data reduction is possible as a result of this measure. The data reduction is particularly great when the signal values are output data of an analog-to-digital conversion and have not yet been equalized. The data reduction is of particular significance for a data stream following the analog-to-digital conversion since an extremely high data rate is present. Indeed, many system resources are set free by the reduction of this data rate. Viewed in a different way, additional degrees of freedom arise in this system design as output data of the analog-to-digital conversion, that are as yet uninfluenced by equalization, contain additional information. This additional information can be economically acquired by the signal evaluation apparatus, or method, of the present invention.

In an embodiment, the present invention provides an adaptive adjustability to the number of places of the exponents according to a prescribable dynamic range and/or to the number of places of the mantissas according to a prescribable signal-to-noise ratio. The dynamic range that can be presented is increased as a result of a high number of places for the exponent, whereas an increased number of places for the mantissas improves the signal-to-noise ratio for a later data interpretation as a result of a more precise value presentation. Proceeding from the interpretability of the signal values by following equalizers and detectors, the number of places can, in turn, be reduced without the quality of the evaluation suffering therefrom given the high redundancy of the evaluation. The information of a plurality of radio blocks can be utilized for setting the number of places.

The inventive method and the signal evaluation apparatus are especially advantageously employed in CDMA (code division multiplex access), GSM or GSM-like mobile radio telephone systems since a power regulation reduces the dynamic range of the signal values and, thus, the more compact presentation of the signal values in floating decimal point format is facilitated. However, employment in DECT systems is likewise possible. A prerequisite for the data reduction in the transmission system is the presence of the signal values (after the transmission) with a number of places that can be reduced compared to the signal-to-noise ratio required in the signal detection.

Additional features and advantages of the present invention are described in, and will be apparent from, the detailed description of the presently preferred embodiments and from the drawings.

DETAILED DESCRIPTION OF THE PREFERRED EMBODIMENT

Figure 1:
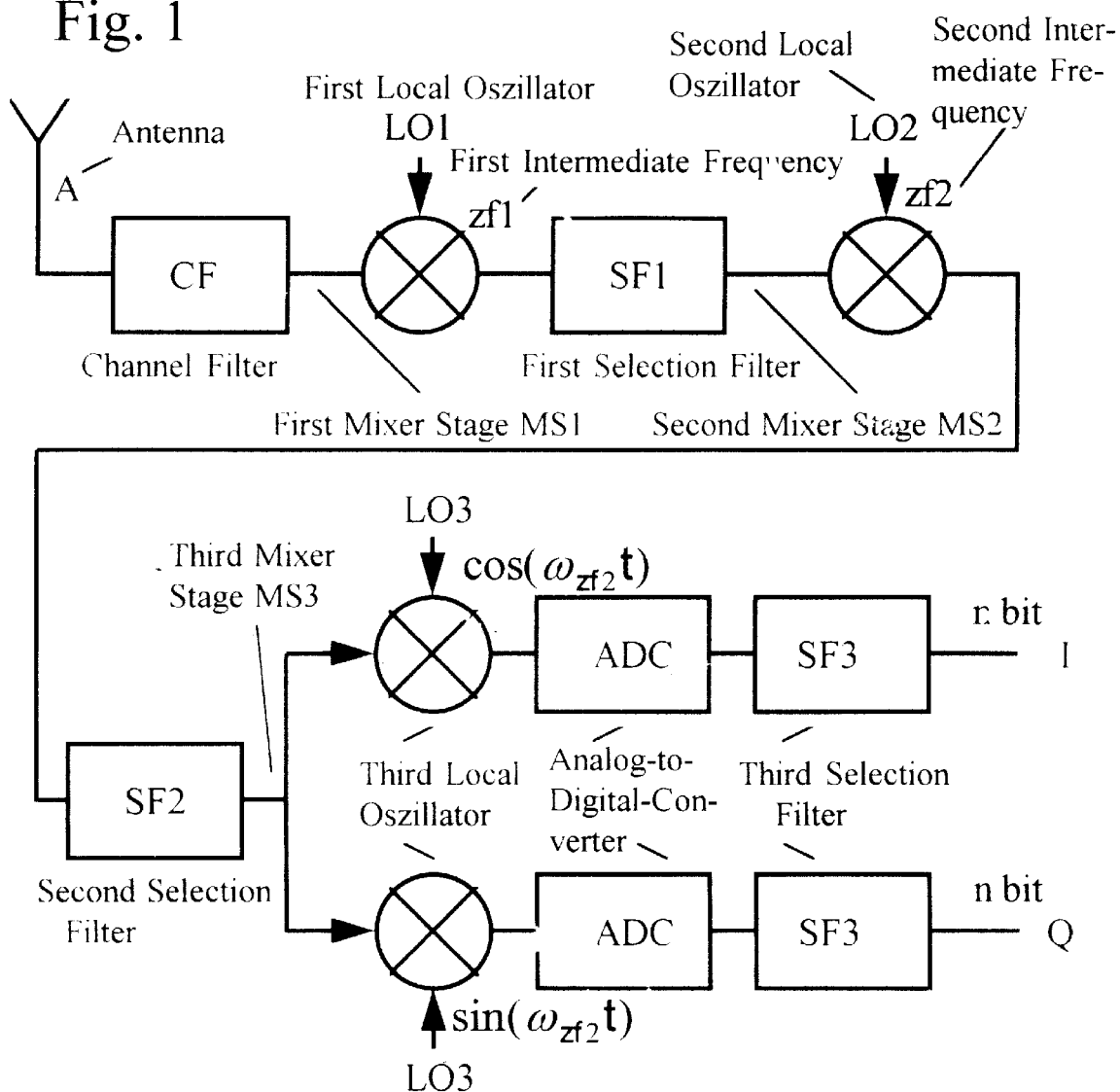
FIG. 1 shows a block circuit diagram of a receiver apparatus in a mobile radio telephone system as is known in the field of art.

Referring to FIG. 1, the invention is explained by way of example on the basis of a receiver apparatus of the GSM mobile radio telephone system. The reception signals are received by an antenna A and supplied to a channel filter CF that filters out a frequency band of, for example, 25 MHZ corresponding to the bandwidth of the GSM mobile radio telephone system. The pre-filtered reception signals are supplied to a first mixer stage MS1 and are mixed therein with oscillator signals generated in a first local oscillator LO1. A first intermediate frequency zf1 arises whose signals are filtered in a following, first selection filter SF1. Noise sources in neighboring channels are thereby suppressed.

Subsequently, the filtered signals of the first intermediate frequency zf1 are mixed with the oscillator signals of the second local oscillator LO2 in a second mixer stage MS2, as a result whereof a second intermediate frequency zf2 arises. A second selection filter SF2 removes further noise sources in adjacent channels.

A demodulator follows that resolves the complex reception signals of the second intermediate frequency zf2 into an in-phase component and a quadrature component and transmits them into the base band. In a third mixer stage MS3, the reception signals with the second intermediate frequency zf2 are mixed with oscillator signals of a third local oscillator LO3 shifted by approximately zero degrees (in-phase) and with approximately 90° (quadrature). The complex baseband signal is now available for further evaluation resolved into its two components. The in-phase component as well as the quadrature component are each converted into digital samples in an analog-to-digital converter ADC. For example, a data stream of 270833 samples per second thus arises, whereby a numerical presentation of 16 bits is standard for the in-phase and quadrature components. 32 bits are thus respectively sampled within 3.69 μs, this corresponding to a data rate of 8.67 Mbit/s. A third selection filter SF3 effects a low-pass filtering for both signal components before the signal values I, Q are processed in accordance with the signal evaluation apparatus, and method, of the present invention.

Figures 2, 3:
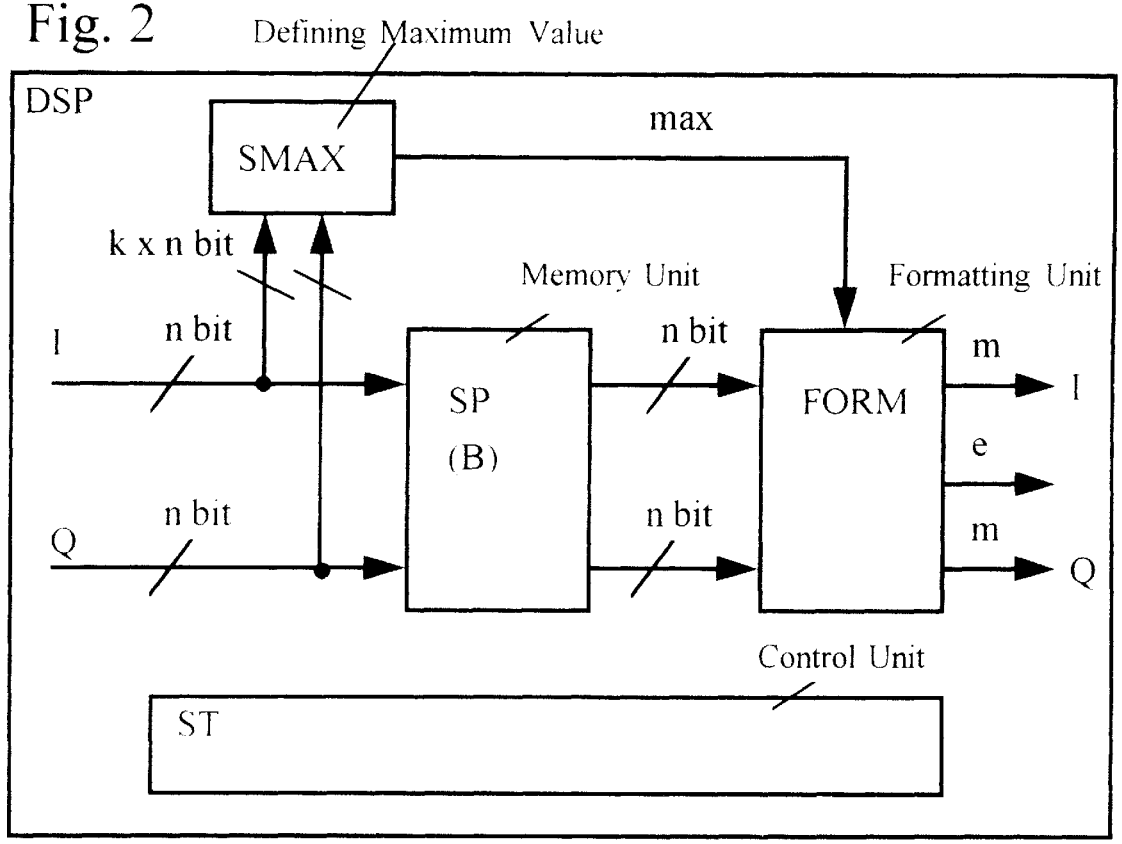
FIG. 2 shows a digital signal processor including an embodiment of a signal evaluation apparatus, and method, in accordance with principles of the present invention.
FIG. 3 shows two versions of the format conversion (fixed decimal point to sloping decimal point) in accordance with principles of the present invention.

According to FIG. 2, the signal evaluation apparatus is comprised of a digital signal processor DSP (the signal evaluation apparatus can also be realized with an ASIC). This digital signal processor DSP accepts the signal values I, Q with respectively M bits (for example, 16 bits). The digital signal processor DSP contains a memory means SP, a means SMAX for defining a maximum value, a formatting unit FORM for formatting the signal values and a control unit ST.

A block B, within the memory SP, that is composed of k signal values I, Q in fixed decimal point format is formed from the signal values I, Q supplied to the digital processor DSP. The means SMAX for defining a maximum value, evaluates the k signal values I, Q of the block B and defines the maximum value, max.

The formatting unit FORM accepts the k signal values I, Q of the block B from the memory SP and additionally processes the maximum value, max. In the formatting unit FORM, the signal values I, Q are converted from fixed decimal point format into floating decimal point format. A particular about the mantissa ,m, and a particular about the exponent ,e, for the entire block B are available at outputs of this formatting unit FORM for the in-phase component I and the quadrature component Q per signal values I, Q.

These data-reduced signal values I, Q can be evaluated in further assemblies of the receiver apparatus, for example, an equalizer and a detector. The reduced data rate makes it possible to provide a bus system in which the output values of the analog-to-digital conversion are offered for further processing with a highly reduced data rate, but largely unfalsified.

The block B thereby corresponds to a radio block according to the respective transmission method of the mobile radio telephone system. Alternatively, half radio blocks, or parts thereof, can also be employed. In particular, it is possible to handle the first samples (converted signals) in the first half-block separately and to view these as a separate block B.

The control unit ST serves to control the storing of the samples in the memory SP. Over and above this, the control unit ST can initiate the formatting unit FORM to set the number of places of the exponent e and the number of places of the mantissa m. The number of places that are set are advantageously based on prescribable dynamic ranges or prescribable signal-to-noise ratios that can be allocated to the momentary transmission conditions and the required transmission quality. Information that is acquired from a number of radio blocks can thereby also be used. As a consequence, the number of places can be set which correspond to a learning function and which are dependent on the transmission conditions.

This method for data reduction can be especially advantageously utilized in CDMA, GSM or GSM-like mobile radio telephone systems when automatic power regulations are provided in these systems. The dynamic range, i.e. the differences between high-power and low-power signals, thereby drops. As a result, the data reduction is facilitated.

The method for formatting shall be explained below with reference to FIG. 3. Two exemplary embodiments a) and b) are presented, both of these referring to supplied fixed decimal point numbers having 10 bits (100 1111 11 and 0000 1111 11). The maximum value, max 1, defined from the signal values I, Q of the in-phase component or of the quadrature component, respectively, amounts to 575 in decimal notation, whereby the data reduction is to be converted into a four-bit mantissa form for both components and into a four-bit presentation for the common exponent e (inversion B with an additional particular about the exponent).

According to version a), the formatting unit FORM defines the maximum plurality of shifts to the right required in order to represent the maximum value, max, with the available places. In this case, it is four bits, whereby an additional bit is reserved for the presentation of the operational sign. The number of shifts to the right represents the exponent e. In the following, all signal values I, Q are shifted toward the right six times, as a result whereof a former presentation which is reduced with respect to the number of places (number of bits) is produced.

According to a second exemplary embodiment b) with the same numerical presentation and same maximum value, max, a factor is additionally defined that is formed by a division of the greatest possible exponent (1111 1111 11) and the maximum value, max (1000 1111 11). All signal values I, Q are subsequently weighted with this factor. In the exemplary embodiment, this factor amounts to 1.779. This factor can be transmitted as a supplement $e_{man}$ with the defined exponent $e_{exp}$ and can be employed in the reconstruction of the signal values (for example, given a level definition). However, a communication of the supplement $e_{man}$ can also be foregone when only the relationship of the signal values to one another is a matter of concern. The number of places of the supplement $e_{man}$ follows from the number of places of the mantissa ,m, plus one bit (as rounding reserved). In the exemplary embodiment, the reconstructed factor is equal to 1111 11/1000 1=1.823, as a result whereof only a negligible error arises.

The advantage of the second exemplary embodiment is that the numerical range can be better exploited. The signal-to-noise ratio in the second exemplary embodiment is better by up to 10 log 1.779=2.5 dB than in the first. By contrast, the first exemplary embodiment manages with less calculating outlay.

The defined exponent ,e, therefore indicates the plurality of shifts to the left in the following signal processing by which the data-reduced signal values I, Q must be shifted in order to recover the original values. Advantageously, the disclosed units SMAX, SP, FORM and ST are realized in a digital signal processor DSP by program-oriented executions or in an application-specific circuit. Such a realization of a digital signal processing unit DSP leads to a substantial data reduction in the transmission of the signal values I, Q and frees system resources that can be utilized for other processing purposes.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for data reduction in the processing of signal values by a digital signal processing unit in a transmission system, comprising the steps of:

storing a block of k signal values wherein each of the k signal values is in fixed decimal point format;

defining a maximum value of the k signal values;

converting each of the k signal values into floating decimal point format so as to reduce a number of digits required to represent the block of k signal values, wherein individual mantissas are respectively determined for each of the converted k signal values and a common exponent is determined for all of the converted k signal values, the common exponent being based on the maximum value of the k signal values and corresponding to a plurality of shifts to the right by which each of the k signal values are shifted;

setting a number of places of the common exponent according to a prescribable dynamic range; and setting a number of places of the individual mantissas according to a prescribable signal-to-noise ratio.

2. The method as claimed in claim 1, wherein the transmission system is a mobile communication system and wherein the step of storing a block comprises storing a block including samples of at least a portion of a radio block.

3. The method as claimed in claim 1, wherein the step of storing a block comprises storing a block with each k signal value including both an in-phase component and a quadrature component.

4. The method as claimed in claim 3 further comprising the step of:

defining a common maximum value for the in-phase component and the quadrature component.

5. The method as claimed in claim 3, further comprising the steps of:

determining a common exponent for the in-phase component and the quadrature component;

determining a first mantissa for the in-phase component; and determining a second mantissa for the quadrature component.

6. The method as claimed in claim 1, further comprising the steps of:

receiving the k signal values at the digital signal processing unit as output data from an analog-to-digital converter.

7. A signal evaluation apparatus for data reduction in the processing of signal values in a transmission system, the apparatus comprising:

memory means for storing at least one block of k signal values wherein each of the k signal values is in fixed decimal point format;

means for defining a maximum value of the k signal values;

means for formatting the k signal values so as to reduce a number of digits required to represent the block of k signal values, wherein each of the k signal values is connected to floating decimal point format such that individual mantissas are respectively determined for each of the converted k signal values and a common exponent is determined for all of the converted k signal values, the common exponent being based on the maximum value of the k signal values and corresponding to a plurality of shifts to the right by which each of the k signal values are shifted;

means for setting a number of places of the common exponent according to a prescribable dynamic range; and means for setting a number of places of the individual mantissas according to a prescribable signal-to-noise ratio.

8. The signal evaluation apparatus as claimed in claim 7, wherein the transmission system is a mobile communication system and the signal evaluation apparatus is a digital signal processor, the apparatus further comprising:

control means for controlling storage of at least a portion of at least one block with k signal values.

9. The signal evaluation apparatus as claimed in claim 8, wherein each of said k signal values includes an in-phase component and a quadrature component and wherein the control means comprises means for controlling storage of both the in-phase components and quadrature components of the respective k signal values.

10. The signal evaluation apparatus as claimed in claim 9, wherein the means for defining a maximum value comprises means for defining a maximum value for both the in-phase component and the quadrature component.

11. The signal evaluation apparatus as claimed in claim 9, wherein the means for formatting comprises means for determining a common exponent and a respective mantissa for the in-phase component and the quadrature component.

12. The signal evaluation apparatus as claimed in claim 7, wherein the means for formatting comprises means for further data reduction by reducing at least one of a number of places for the mantissas and a number of places for the exponents of a plurality of blocks.

* * * * *